April 1, 1969 J. G. WILKES 3,436,285

COATINGS ON GERMANIUM BODIES

Filed Sept. 2, 1965

INVENTOR.
JOHN G. WILKES
BY
AGENT

United States Patent Office 3,436,285

Patented Apr. 1, 1969

3,436,285

COATINGS ON GERMANIUM BODIES

John George Wilkes, Hatch End, England, assignor to North American Philips Company, Inc., New York, N.Y., a corporation of Delaware Filed Sept. 2, 1965, Ser. No. 484,707
Claims priority, application Great Britain, Sept. 4, 1964, 36,290/64
Int. Cl. H01l 7/50
U.S. Cl. 156—17 7 Claims

ABSTRACT OF THE DISCLOSURE

A method of removing tetragonal germanium dioxide from the surface of a germanium body in which the dioxide is reduced with titanium and the reaction products removed.

This invention relates to methods of removing coatings of tetragonal germanium dioxide from germanium bodies.

With silicon semiconductor devices, silicon dioxide may be used to passivate the semiconductor surface, to define diffusion areas and to slow down the diffusion of impurities into the semiconductor surface. Silicon dioxide may be formed on the silicon surface by oxidation at high temperatures and the techniques of forming a silicon dioxide layer and opening diffusion windows therein are now well known. Similar techniques have not been used with germanium because oxide layers formed did not have suitable proporties, since the common, hexagonal form of germanium dioxide is soluble in water, although it has been suggested to use silicon monoxide as a diffusion mask.

In British patent specification No. 976,559 the formation of a coherent layer of tetragonal germanium dioxide on a germanium substrate is described; this layer has properties which indicate that it is suitable for use on germanium in methods analogous to the use of silicon dioxide on silicon. Tetragonal germanium dioxide may also be used as a resistor or dielectric material for planar semiconductor work and as a crucible surface material. The layer of tetragonal germanium dioxide is extremely un-reactive, it is insoluble in water or hydrofluoric acid and is only slowly dissolved by a hot 50% solution of sodium hydroxide. Thus the use of photoresist or planar technique on a germanium body having such a layer on its surface would be difficult unless a method could be used which dissolved the germanium dioxide rapidly and was amenable to photoresist techniques.

The invention provides a method for the removal of tetragonal germanium dioxide from a germanium surface suitable for use with photoresist techniques.

According to the invention in a method for the removal of tetragonal germanium dioxide from the surface of a germanium body, the dioxide is reduced with titanium and the reaction products removed. The titanium may be limited to certain areas of the surface of the tetragonal germanium dioxide layer. The limitation of the titanium to certain areas may be obtained by deposition of the titanium through a mask or by photoresist techniques e.g. applying a photoresist, on a layer of titanium covering the surface of the layer of tetragonal germanium dioxide or applying a photoresist directly on the layer of germanium oxide and depositing the titanium onto the surface with the formed photoresist mask.

Figure 1:
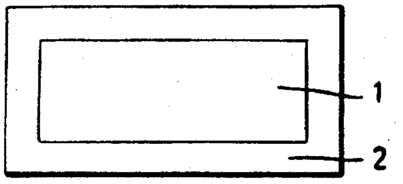
Figure 5:
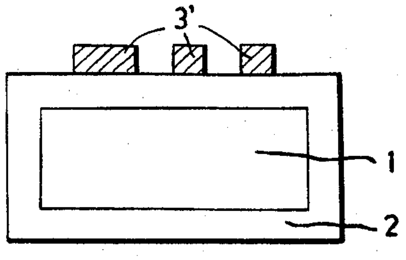
Figure 2:
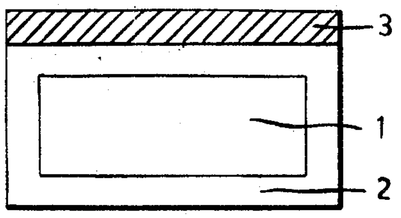
Figure 6:
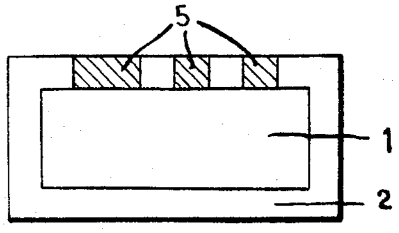
Figure 3:
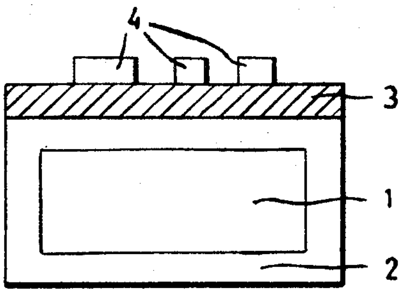
Figure 7:
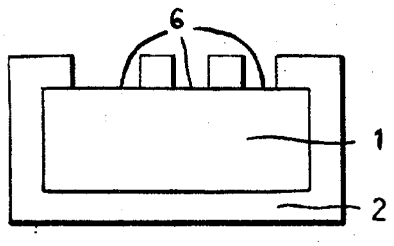
Figure 4:
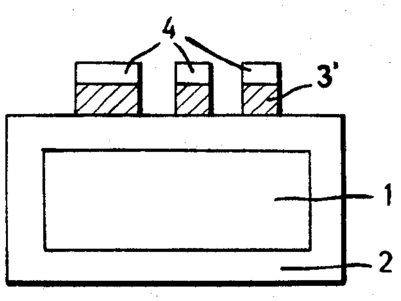

One example of the method according to the invention will now be described more fully with reference to the diagrammatic drawing in which FIGURES 1–7 show a vertical section of a germanium wafer and the sequence of operations in the method according to the invention.

The steps of the method are as follows:

(I) Use is made of a germanium wafer 1, the surface of which is covered with a layer of tetragonal germanium oxide 2.

(II) A layer of titanium 3 is evaporated over this layer under vacuum using the normal vacuum techniques. The amount of titanium deposited depends on the thickness of the germanium dioxide layer which it is required to remove; 0.6$\mu$ of titanium is sufficient to remove a 1$\mu$ layer of tetragonal germanium dioxide.

The vacuum pressure is approximately $2 \times 10^5$ mm. at the beginning of the deposition, this decreases when the titanium is deposited because of the gettering effect of the titanium.

(III) A photoresist pattern 4 is placed upon the titanium layer by using known methods.

(IV) The exposed titanium is removed by an etchant, that found suitable being—

| | Vols. |
|---|---|
| Concentrated hydrofluoric acid | 1 |
| Concentrated nitric acid | 4 |
| Distilled water | 160 |

This etchant removes the exposed titanium rapidly but does not affect the photoresist 4, a titanium pattern 3' is thus protected on the surface of the tetragonal germanium dioxide.

(V) The photoresist 4 is then removed by immersion of the germanium body in an organic solvent or a hot chromic acid solution. The germanium dioxide layer 2 now has sharply defined areas 3' of titanium on its surface.

(VI) The germanium body is heated to approximately 540° C. for one hour in an atmosphere of argon, the titanium reduces the germanium dioxide to metallic germanium and itself forms titanium dioxide to produce reaction products in the volume 5. The temperature and time stated above would be sufficient to remove 1$\mu$ of germanium dioxide. A more rapid process is obtained at a higher temperature, at 600° C. when 1$\mu$ of germanium dioxide is removed in three minutes. This higher temperature process also gives better definition and is therefore preferred.

(VII) The titanium dioxide is removed by washing the germanium body in concentrated hydrofluoric acid and the amorphous germanium and excess titanium are removed at the same time by physical action. If the germanium is not removed by this etchant a diluted conventional germanium etch may be used subsequently. Because the germanium is in amorphous form it is removed very rapidly and the germanium substrate is only very slightly etched. Areas 6 of the surface of the germanium substrate are now available for diffusion processes or for applying metal contacts onto the exposed germanium surface regions, e.g. by evaporation.

When a layer of tetragonal germanium dioxide is formed on the surface of a germanium device over a PN junction and the device heated to approximately 600° C., it has been found that the reverse current of the device increases. This increase in the reverse current can be reduced by heating the device for about 12 hours at 250° C. prior to subjecting the structure to a high temperature process.

Similarly if a germanium surface on which a layer of tetragonal germanium oxide has been formed is first heated at 250° C. and then subsequent high temperature processes, such as that used in the method according to the invention, used in device fabrication, the devices obtained have a reverse current characteristic not increased to such an extent as if the step of heating to 250° C. were omitted.

The tetragonal germanium dioxide layer is then suitable for use as a passivation layer on the germanium surface.

What is claimed is:

1. A method of removing at least portions of a coherent layer of germanium dioxide having a tetragonal crystal structure on the surface of a germanium substrate, comprising contacting the said layer portions to be removed with titanium, heating the titanium-contacted portions at an elevated temperature sufficient to reduce the germanium dioxide forming reaction products including germanium and titanium dioxide, and removing the reaction products exposing the surface of the underlying germanium substrate.

2. A method as set forth in claim 1 wherein the portions to be removed include spaced areas of the tetragonal germanium dioxide forming holes in the coherent layer after the reaction product removal step.

3. A method as set forth in claim 2 wherein titanium is contacted to the spaced areas by vapor-deposition through a mask having a hole pattern corresponding to the pattern of spaced areas.

4. A method as set forth in claim 2 wherein, before the reducing step, a layer of titanium is applied over the layer of tetragonal germanium dioxide, a layer of a photoresist is applied over the layer of titanium, holes are formed in the photoresist over the germanium dioxide layer portions which are to remain on the substrate in order to expose the underlying titanium, and the exposed titanium is subjected to an etching treatment to remove same leaving in position titanium in contact with the spaced areas of the germanium dioxide to be removed.

5. A method as set forth in claim 1 wherein the reducing step is carried out at a temperature of approximately 540° C. or higher.

6. A method as set forth in claim 5 wherein, prior to the reducing step, the germanium dioxide covered germanium substrate is preheated at 250° C.

7. A method as set forth in claim 1 wherein the reaction products removal step includes an etching treatment.

References Cited

A Diffusion Mask for Germanium, E. J. Jordan, Journal of the Electrochemical Socicly, May 1961, vol. 108, No. 5, pp. 478–481.

JACOB H. STEINBERG, *Primary Examiner.*

U.S. Cl. X.R.

148—187, 179; 117—201, 205